United States Patent [19]
Coates et al.

[11] 3,931,517
[45] Jan. 6, 1976

[54] FIELD EMISSION ELECTRON GUN

[75] Inventors: Vincent J. Coates, Los Altos; Leonard M. Welter, Saratoga, both of Calif.

[73] Assignee: American Optical Corporation, Southbridge, Mass.

[22] Filed: Jan. 2, 1975

[21] Appl. No.: 537,880

Related U.S. Application Data

[60] Division of Ser. No. 225,970, Feb. 14, 1972, abandoned, and a continuation-in-part of Ser. No. 46,425, June 15, 1970, Pat. No. 3,678,333.

[52] U.S. Cl. .............. 250/310; 250/311; 313/336; 315/31 R
[51] Int. Cl.² ..................................... H01J 37/285
[58] Field of Search ......... 250/307, 310, 311, 398; 313/336, 348, 356; 315/31; 328/233

[56] References Cited
UNITED STATES PATENTS 3,141,993  7/1964  Hahn ......................... 315/31
3,191,028  6/1965  Crewe ....................... 250/311 X Primary Examiner—Archie R. Borchelt
Assistant Examiner—E. R. LaRoche
Attorney, Agent, or Firm—H. R. Berkenstock, Jr.; William C. Nealon

[57] ABSTRACT

A field emission gun in which a field emission tip for generating charged particles is axially aligned with apertures in an intermediate electrode and a main electrode. A field electrode is placed in juxtaposition to the field emission tip for developing a particle generation field. This electrode is located relative to the field emission tip and the intermediate electrode to effect a predetermined focal distance and level of electron beam intensity. Use of a field electrode permits utilization of lower focusing and acceleration voltages and renders the device less sensitive to variations in field emission tip design and performance.

7 Claims, 2 Drawing Figures

FIELD EMISSION ELECTRON GUN

This is a division of application Ser. No. 225,970, filed Feb. 14, 1972, now abandoned; and this application is a continuation in part of parent copending application Ser. No. 46,425, filed June 15, 1970 and which has matured into U.S. Pat. No. 3,678,333.

BACKGROUND OF THE INVENTION

The invention relates, in general, to field optical systems and more particularly to a field emission gun capable of producing an intense beam of focused particles.

In the applicant's co-pending patent application, Ser. No. 46,425, filed June 15, 1970 which issued as U.S. Pat. No. 3,678,333 there is described a scanning electron microscope employing a field emission tip as its source of electrons, which application is herein incorporated by reference. An electron microscope belongs to the family of devices known generically as microprobes, each member of which can utilize the field emission tip of the present invention. The use of the field emission tip allows the formation of a high intensity focused beam of charged particles providing the illumination needed in scanning microscopy. The electron gun of the co-pending application provides and maintains the high vacuum requirements of a field emission tip and incorporates a high degree of voltage discharge protection which, in the past, have been significant problems in the application of field emission tips to scanning electron microscopes. In implementing the high voltage protection of the field emission gun, a shield electrode placed about the tip periphery and a field electrode placed in the neighborhood of the field emission tip were added to the system. In the context of discharge protection the presence of the field electrode permits control of emission current and particle acceleration, thus returning the operation of the gun to the condition as found prior to incorporating the high voltage discharge protection shield.

It is often desirable to operate a field emission electron gun as a self-focusing electron accelerating system without the use of additional de-magnification lenses, i.e., the gun is utilized to form a focused image of the electron beam in an appropriate image plane without any additional lenses other than that provided by a main acceleration electrode and an intermediate electrode.

In prior art field emission guns employing only two electrodes, viz. intermediate and main electrodes, the self focusing mode of operation may require high extraction voltages on the intermediate electrode to achieve sufficient field strength to produce a useful level of current in the focused spot and commensurately high acceleration voltages on the main electrode to achieve acceptable focal distances. It also demanded extremely fine geometry of the field emission tip, generally a diameter of less than 1000A. If the tip exceeded this size it was necessary to place it closer to the intermediate electrode with concomitant unacceptable dislocation of the image plane.

Related to the foregoing problems, in prior art field emission guns any changes in the operational performance of the field emission tip itself such as geometrical deterioration or changes in work function of the emitting surface due to contamination manifested a significant alteration in microscope operation. The intensity of the beam as well as the location of the image plane were altered and needed system adjustment to return to an acceptable or desirable performance condition.

It is, therefore, an object of this invention to provide an improved field emission particle gun. It is another object of this invention to provide a self-focusing field emission electron gun. Another object of this invention is to provide a field emission electron gun less sensitive to variations in field emission tip performance and configuration. Yet another object of this invention is to provide a field emission electron gun producing minimum contamination in the area contiguous with the field emission tip. Yet another object of this invention is to provide a field emission electron gun capable of performing at minimum levels of focusing and acceleration voltages. It is still another object of this invention to provide a field emission electron gun in which the field emission tip is protected from high voltage discharges.

SUMMARY OF THE INVENTION

As contemplated by the applicants' invention, a field emission tip acts as a source or generator of charged particles. Electrode means aligned with the field emission tip apply appropriate focus and acceleration fields to form a beam of the charged particles. Voltage means are connected to the electrode means for supplying electical potential to establish the focus and acceleration fields. A field electrode is connected to the voltage means and placed in juxtaposition to the field emission tip for developing a particle generation field. It is located at a distance from the field emission tip selected so as to effect a predetermined focal distance and level of beam intensity.

For a better understanding of the present invention together with other and further objects thereof, reference is had to the following description taken in connection with the accompanying drawings while its scope is pointed out in the appended claims. It is emphasized that the preferred embodiments herein described are intended to be illustrative of the applicants' invention and in no way delimiting of its scope.

Conventional symbols are used throughout the drawings and like numbers are used for like or similar parts in each view. The drawings are intended to be illustrative and exemplary of the invention and thus may not always conform to actual practical embodiments but rather are shown to best point out and amplify the applicants' novel contribution to the state of the art.

DESCRIPTION OF THE PREFERRED EMBODIMENTS

Figure 1:
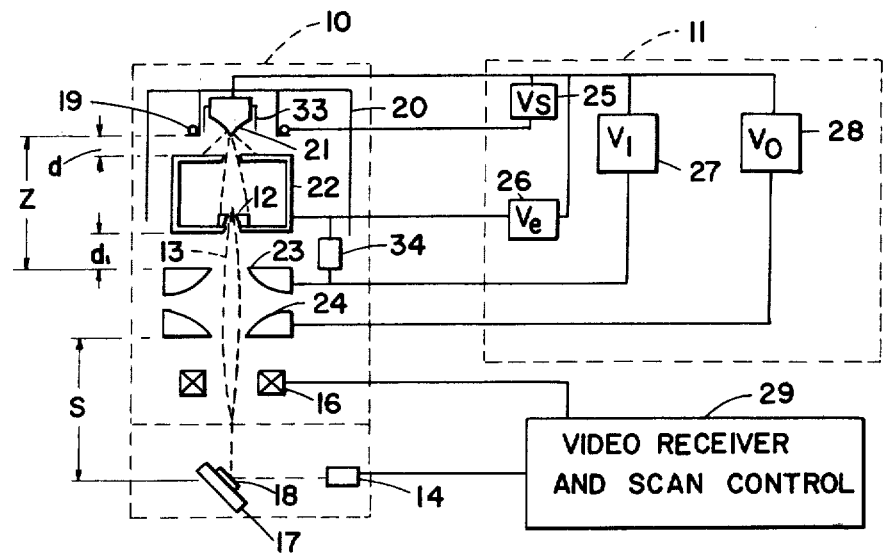
FIG. 1 is a functional schematic diagram of a field emission scanning microscope embodying the applicants' invention.

The electron optical system of FIG. 1 is in the form of a scanning electron microscope 10 embodying therein a field emission gun capable of conforming to the applicants' invention. It is significant to point out that while the illustrated field emission gun is used to produce electrons as the illuminating particles, it is possible that the same source be used to produce other charged particles, e.g. positively charged particles such as ions. In using positively charged ions it is necessary that the extraction voltages and focusing fields be reversed to provide the necessary emission, acceleration and focusing forces. It is further required that an ionizable gas be admitted to the chamber by suitable valve and regulator means, well known in the art.

Ancillary to the scanning electron microscope, there is shown a potential source or voltage means 11 which provides the various levels of operating voltages to the electrodes of the scanning electron microscope 10. A second unit, the video receiver and scanning control 29 in combination with the scanning and detector portions of the scanning electron microscope 10 display the desired view of the specimen undergoing interrogation.

The field emission tip 21 constitutes the main feature of field emission scanning microscopy systems. It produces a highly coherent, high intensity supply of electrons capable of being focused to a spot of desired size at an image plane containing a specimen 18. Specimen 18 is shown mounted to a specimen holder 17 which positions it with respect to the focused beam 13. The beam of charged particles, or, as in the system configuration of FIG. 1, electrons, is primarily formed by electrode means comprising electrode 23 and electrode 24. Electrode 23 constitutes an intermediate electrode interposed between the field emission tip 21 and a main electrode 24 located distally of intermediate electrode 23 with respect to the field emission tip 21. Both electrodes 23 and 24 have apertures axially aligned with the field emission tip 21 for focusing and accelerating the electrons forming the beam of charged particles 13. In the broad context of a field emission system wherein the emitted corpuscular particles may be either positive (ions) or negative (electrons) members 23 and 24 are generally denoted electrodes. In the context of a reference to a field emission device wherein the emitted particles are electrons, electrodes 23 and 24 are commonly referred to as anodes. See, for example, the parent application, now U.S. Pat. No. 3,678,333.

The main accelerating voltage $V_0$ 28 is supplied to electrode 24 and its magnitude is selected relative to the potential of field emission tip 21. Normally, when used as an electron source, the field emission tip 21 is placed at a potential below system ground with the main accelerating electrode held at ground. Intermediate electrode 23 is supplied by voltage source $V_1$ 27 which potential is lower than the potential of electrode or anode 24 with respect to the charged particles forming beam 13. The magnitude of voltage $V_0$ is, of course, indicative of final particle energy while the ratio of the intermediate electrode 23 voltage $V_1$ and $V_0$ is essentially determinative of the focal distance of the beam below anode 24, which distance is indicated as S in FIG. 1. As previously stated, the intermediate voltage $V_1$ is almost exclusively determinative of the level of beam 13 current.

Extraction electrode 22, is in juxtaposition to field emission tip 21 and has centrally located apertures axially aligned with apertures of electrodes 23 and 24 and the field emission tip 21; thus the electrons extracted from field emission tip 21 pass through the apertures of extraction electrode 22 and anodes 23 and 24 to be finally focused upon specimen 18. The portion of electrode 22 proximal to the field emission tip 21 is at a distance $d$ from field emission tip 21 and its aperture provides a large entrance angle so that a portion of the beam of electrons extracted from field emission tip 21 pass therethrough without substantial interference. The distal aperture portion 12 of extraction electrode 22 is placed relatively close to electrode 23 and its aperture is considerably smaller thus being determinative of the ultimate beam 13 size. The distal portion of extraction electrode 22 is placed a distance $d_1$ from electrode 23.

Shield electrode 20 is utilized to prevent high voltage discharges from the outer chamber of the field emission gun to the field emission tip 21. This shield 20 is essentially an annular shaped metal electrode located peripherally about the field emission tip 21 and the extraction electrode 22. It is the presence of shield electrode 20 that establishes one function of field electrode 22. Without the field produced by field electrode 22 within the area defined by the shield 20, it would be difficult to achieve desirable operation of the device.

In addition to its function as a discharge protector for field emission tip 21, the shield 20 acts as a condensing structure for titanium or other metal of suitable character sublimated from the coil 19. This action of the coil 19 and the shield 20 constitutes a vacuum pump in the neighborhood of the field emission tip 21 thereby maintaining the essential high vacuum necessary to proper operation of field emission devices. The vacuum pumping afforded by this system in conjunction with the inherent ion pumping provided by the combination of the extraction electrode 22 and the field emission tip 21 i.e., ionization by primary beam and secondary electrons, permits the attainment of vacuum levels in the order of $10^{-9}$ to $10^{-11}$ Torr in the neighborhood of the field emission tip 21. The potential of field electrode 22 is supplied from the voltage means 11 by $V_e$ 26. $V_e$ is selected to provide a field strength in the neighborhood of the field emission tip 21 necessary to generate or extract the electrons or charged particles. Sublimation coil 19 is supplied with voltage $V_s$ 25 from the voltage means or source 11. Extraction electrode 22 is connected to intermediate electrode 23 through impedance Z 34, thereby preventing the extraction voltage from rising to the main acceleration voltage in the event of discharge between intermediate electrode 23 and electrode 24.

The lens system 16 is primarily intended for control of beam 13 to scan the specimen 18 in a programmed manner. Essentially, it constitutes deflection coils synchronized to the scanning system for control of video receiver 29 thereby locking the scan of the specimen 18 and the scan of the video field of the receiver 29. Detector 14 is typical of any number of detectors which may be placed so as to receive or detect information obtained from the surface or transmitted through the specimen 18. Information may be obtained by detecting transmitted electrons, as in the case of a transmission electron microscope, secondary electrons, reflected electrons, absorbed electrons, photons or x-rays, any and all of which are generated by or from the electron or charged particle beam 13.

Figure 2:
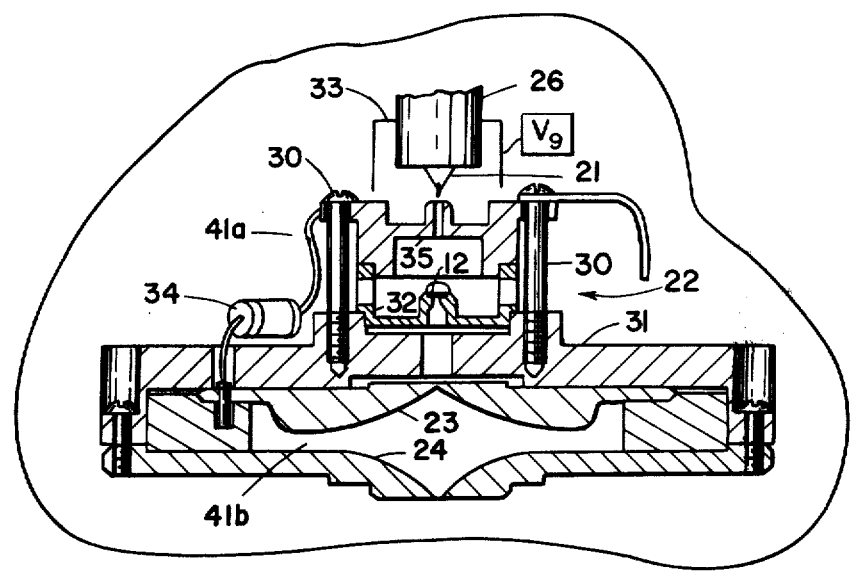
FIG. 2 is a partial cross-sectional view of a typical field emission scanning electron microscope showing features in accordance with the applicants' invention.

Referring to FIG. 2, there is shown in partial cross-section a typical structural implementation of the applicants' invention.

Previously referred to co-pending application Ser. No. 46,425 amply sets out the structural details of a typical field emission electron gun of similar construction. Electrodes 23 and 24 may be shaped field lenses having centrally located and aligned apertures. The geometry of electrodes 23 and 24 may conform generally to the shapes calculated by J.W. Butler and described in a paper by A. V. Crewe, D. N. Eggenburger, J. Wall, and L. M. Welter entitled "Electron Gun Using a Field Emission Source," Volume 39, Number 4, the Review of Scientific Instruments, April 1968, page 580. The field emission tip 21 is shown mounted to an insulator post 26 centrally aligned with the apertures of electrodes 23 and 24. The necessary electrical connections are brought to it through vacuum insulated connectors extending through the outer housing 10 of the field emission electron gun and the shield electrode 20, shown extending about both the field emission tip 21 and the insulator post 26. The location of the tip 21 is axially adjustable which mechanism is described in co-pending application Ser. No. 46,425 and may be accomplished by any suitable means well known in the art.

Sublimation coil 19 is shown extending about the outer surface of a depending flange which acts as a geometrical shield preventing $T_i$ from coating the tip or apertures or insulators of shield electrode 20 surrounding a portion of the insulator post 26. Again, appropriate voltage connections to the sublimator coil 19 are made through insulated connectors.

Electrode 22 is shown as having two main members, an upper member 23 in juxtaposition to field emission tip 21 with a wide angle aperture centrally aligned with the apertures of electrodes 23 and 24. A second lower member 32 is placed distally of field emission tip 21 in close proximity to electrode 23 and contains a second centrally located aperture 12 usually having a substantially smaller diameter in the neighborhood of 20 to 400 microns, which aperture is determinative of beam 13 size. The entire structure of extraction electrode 22 is mounted to insulator 31 by means of threaded members 30. The side walls or peripheral portions of extraction electrode 22 are essentially open to permit passage of ionized particles and contaminants therethrough.

Both the aperture of member 35 as well as that of member 32 are raised above the surrounding surface of their respective members. This plateaued structure creates a well area about the periphery of the apertures serving to capture and retain contaminant materials. When transversely dispersed portions of the field current strike the aperture surface significant contamination is generated which if not properly controlled may affect aperture as well as tip 21 performance.

In considering the operational characteristics of a field emission scanning electron microscope employing the applicants' novel contribution, reference will again be had to FIG. 1. In operating the field emission electron gun as a self-focusing electron accelerating system, i.e., without the use of any additional lenses other than that provided by electrodes 23 and 24, the prior art requires high values of accelerating voltages $V_0$ and $V_1$. For tips with diameter of >2000 A voltage $V_0$ is in excess of 20,000 volts while the potential of intermediate electrode 23 $V_1$ is in the range of 3500 volts. The use of these high potentials, of course, as previously indicated, creates problems with respect to high voltage discharge to the field emission tip 21 as well as to tip 21 location, performance and configuration. It is the use of shield electrode 20 and extraction electrode 22 which principally obviates these difficulties. Referring to the applicants' co-pending application Ser. No. 46,425, there is contained full diclosure and teaching as to both the structural and operational requirements of shield electrode 20, extraction electrode 22, and voltage means 11 (action of Z34) toward the discharge protection of field emission tip 21 and related performance of the field emission electron gun.

The applicants' have discovered that use of extraction electrode 22 also greatly simplified operation of the gun and allowed selection of reasonable beam current Ib, image plane distance and accelerating voltage $V_0$ with relative ease and over a wide range. To reiterate, the prior art to achieve this result necessitated the use of difficult-to-make and delicate tips having diameters of less than 1000A placed in close position to the intermediate electrode 23 and the use of relatively high acceleration and focus voltages to achieve acceptable levels of Ib and image plane locations. With the addition of field electrode 22 it becomes possible to obtain needed beam current at practical S distances (approximately between 5 and 20 cm) while using a blunter tip located farther from intermediate electrode 23. Also, therefore, the spot size of the beam 13 and ultimately the resolution is improved.

It is important to realize that axial location Z of the tip 21 farther from intermediate electrode 23 reduces the required focusing and thus the ratio of $V_1$ to $V_0$. This ratio reduction of course leads to lower acceleration voltages and minimizing of discharge problems. It further allows generation of lower energy beams where desirable. In operation of the applicants' system it is possible to maintain Ib level and image plane distance S by minor adjustment of tip 21 to electrode 22 distance $d$, voltages $V_1$ and $V_0$ or both. Further, tip 21 diameters in the range of 1500A to 3000 A may be successfully used thereby greatly simplifying their fabrication. The distance $d_1$ between field electrode 22 and intermediate electrode 23 is generally held constant but may be altered to achieve special purposes. Its separation from intermediate electrode 23 permits the interposing of an insulator member 31, further adding to the high voltage discharge protection of the system.

In normal operation, field electrode voltage $V_e$ is approximately equal to the intermediate electrode 23 voltage $V_1$. It is possible to place this field electrode 22 quite close to the tip 21 thereby necessitating only a low emission voltage $V_e$ to obtain the desired field emission from the field emission tip 21. When placed at distance $d$ between approximately 0.5 millimeter and six millimeters of the field emission tip 21, normal emission levels and focusing of beam 13 may be attained with the use of relatively low voltages for $V_e$, $V_1$ and $V_0$ with respect to the prior art. Typical approximate performance values are:

```
Ib = 1×10⁻¹⁰ amps        S = 5 - 20cm
Ve = 2000 - 3000         d = 0.1 - 5mm
V₁ = 2000 - 3000         Z = .5 - 10 cm
V₀ = 5000 - 20,000       Spot Size = 100A - 2000A
```

As the extraction voltage $V_e$ is lowered, the voltage $V_0$ may be significantly lowered requiring only that the ratio of $V_1$ to $V_0$ remain appropriate to establish the desired focal plane distances.

The applicants' have further discovered, when using the electrode structure of FIG. 2, it is possible to obtain substantially larger beam current 13 at the same resolution.

An absolute increase in beam current 13 of course permits the attaining of smaller beam 13 spot size at lower current values, therefore improving the inherent resolution capabilities of the system. In quantitative terms an approximately 9 to 1 increase in beam current for the same spot size has been achieved.

The basis for the increase in beam 13 intensity is not at this time understood although it is believed to be related to the creation of a field free, drift region between the upper member 35 and lower aperture control member 32 of field electrode 22. This region is normally approximately 2 cm in axial length but may be substantially varied without significantly affecting the improved performance.

It is important to realize that to achieve improved performance regarding only control of beam intensity and focal plane, field electrode 22 structure may simply comprise a single member, similar to upper mamber 35 and that shown in Application Ser. No. 46,425 containing a beam defining aperture for providing the appropriate emission field. It is to be further noted, as described in co-pending application Ser. No. 46,425 filed 6/15/70, that differential pumping between chamber regions 41b and 41a proceeds through the aperture of intermediate electrode 23 thereby maintaining them at different vacuum levels. In the electron generation mode upper region 41a is of course at a lower pressure while in an ion mode, where gas is introduced, the opposite is true due to the partial pressure of the gas and differential pumping proceeds in a reverse direction.

The use of field electrode 22 also makes possible the introduction of a second lens into the system. If voltage $V_r$ is controlled independently of $V_1$ a focusing field may be created between field electrode 22 and intermediate electrode 23 thereby altering the focal length of the system as well as beam 13 spot size.

Recalling that successful operation of a field mission tip electron gun requires a high of degree of vacuum and cleanliness in the vicinity of the tip 21, features of the applicants' invention relative to this important aspect are now described. The pumping arrangement, as previously mentioned, in the area of the tip 21 may be considered a form of ion pumping and trapping. Other techniques of stopping ions from bombarding the tip 21 also result in improved tip stability and system reliability. To enhance this purpose, a cylindrical member 33 of FIG. 2 is mounted on the tip column 26 concentric with the axis of field emission tip 21 and coextensive therewith and connected to a voltage source $V_g$. When ions are produced at the surface of the upper portion of field electrode 22, they are attracted toward the member 33. Since member 33 is a substantially open structure many of the attracted ions can pass through the screen and ultimately be trapped on the shield electrode 20 operating in combination with the sublimator coil 19. This results in fewer ions hitting the tip 21 and thus less geometric distortion, improved local pressure and ultimately improved stability.

Another feature of the applicants' invention directed toward minimizing tip contamination is the use of a large entrance angle aperture in the upper portion of field electrode 22 thereby preventing any significant portion of beam 13 current hitting the extraction electrode 22 and causing the release of contamination in the area of the field emission tip 21. The fact that the field emission tip 21 is placed relatively close to the field electrode 22 enhances this feature of the field emission gun 10 and further limits impingement of the beam 13 on field electrode 22. Other means may be employed in achieving this desired result such as axially collimating the current from field emission tip 21 e.g., by coating the tip with zirconium or other high work function metal or appropriately altering the tip geometry such that the main emission is derived from a smaller than normal source.

After passing through the upper aperture of field electrode 22, the beam 13 is allowed to impinge upon the lower aperture structure 12, thus delimiting the size of the beam to a desired diameter and containing the creation of contaminants to a point distally removed from the field emission tip 21. Therefore, upper aperture member 35 of extraction electrode 22 is principally used to extract electrons from the field emission tip 21, the electrons are controlled to pass substantially through the upper aperture and allowed to bombard surface further downstream removed from the field emission tip 21. The field emission tip 21 is then protected from pressure and ions produced by impingement of the beam 13 on aperture 12 by utilization of any one or combination of magnetic ion trapping, electrostatic ion trapping or mechanical ion shielding. As shown in the embodiment of this application, electrostatic ion trapping, mechanical ion shielding and the use of sublimation techniques are employed. It is significant to note that the connection of chamber portion 41a and 41b through the aperture of intermediate electrode 23 permits differential pumping between those two areas and maintenance of portion 41a at a higher vacuum level.

In summary, the applicants have introduced to the state of the art an improved field emission charged particle gun. It incorporates a uniquely structured and located extraction electrode permitting the use of lower accelerating and focusing voltages in a self focusing mode. The unique structure of the applicants' further enhances the stability and reliability of the system by achieving improved vacuum pumping and contamination-free operation in the area contiguous with the field emission tip. It is reiterated that the applicants' invention as set forth herein is exemplary and illustrative of the apparatus and techniques employed and is not intended to be delimiting of its scope.

What is claimed is:

1. In a charged particle microprobe system including a housing defining a vacuum chamber, a field emission tip disposed in said chamber for generating said charged particles, electrode means for establishing focusing and accelerating fields for forming a beam of said charged particles and a shield electrode disposed such that said field emission tip is within the region of said shield and voltage means connected to said electrode means, said shield electrode and said field emission tip for supplying electrical potential to said electrode means to establish said focusing and accelerating field, the improvement comprising a member disposed generally radially about said field emission tip and substantially coextensive therewith intermediate said tip and said shield, means connecting said member to said voltage means to establish a field for attracting stray particles in the region contiguous said field emission tip.

2. The improvement accroding to claim 1 wherein said member is substantially cylindrical in shape and axially aligned with said tip.

3. The improvement according to claim 2 wherein said member is composed of a material substantially penetrable by said particles.

4. The improvement according to claim 3 wherein said member is screen-like.

5. The improvement according to claim 1 including means disposed in said shield region for subliming a layer of getter material on said shield whereby said stray particles are captured thereon.

6. The improvement according to claim 5 wherein said sublimation means includes a filament of said getter material located within said region.

7. The improvement according to claim 6 wherein said getter material is titanium.

* * * * *